(12) United States Patent
Takahashi

(10) Patent No.: US 9,753,075 B2
(45) Date of Patent: Sep. 5, 2017

(54) INSPECTION APPARATUS AND INSPECTION METHOD

(71) Applicant: NIDEC-READ CORPORATION, Kyoto (JP)

(72) Inventor: Tadashi Takahashi, Kyoto (JP)

(73) Assignee: NIDEC-READ CORPORATION, Kyoto (JP)

(*) Notice: Subject to any disclaimer, the term of this patent is extended or adjusted under 35 U.S.C. 154(b) by 20 days.

(21) Appl. No.: 14/782,602

(22) PCT Filed: Apr. 8, 2014

(86) PCT No.: PCT/JP2014/002005
§ 371 (c)(1),
(2) Date: Oct. 6, 2015

(87) PCT Pub. No.: WO2014/167838
PCT Pub. Date: Oct. 16, 2014

(65) Prior Publication Data
US 2016/0054366 A1 Feb. 25, 2016

(30) Foreign Application Priority Data

Apr. 9, 2013 (JP) .................................. 2013-081279

(51) Int. Cl.
*G01R 31/02* (2006.01)
*G06F 3/044* (2006.01)
*G06F 3/047* (2006.01)

(52) U.S. Cl.
CPC ........... *G01R 31/021* (2013.01); *G06F 3/044* (2013.01); *G06F 3/047* (2013.01)

(58) Field of Classification Search
CPC combination set(s) only.
See application file for complete search history.

(56) References Cited

U.S. PATENT DOCUMENTS

2004/0164755 A1* 8/2004 Yamaoka ............. G01R 31/312
324/754.28

FOREIGN PATENT DOCUMENTS

JP   S63226688 A   9/1988
JP   2001084904 A   3/2001
(Continued)

OTHER PUBLICATIONS

International Search Report issued in the corresponding PCT International Application No. PCT/JP2014/002005 dated Jul. 22, 2014, 2 page.

*Primary Examiner* — Clayton E Laballe
*Assistant Examiner* — Jas Sanghera
(74) *Attorney, Agent, or Firm* — Viering, Jentschura & Partner mbB

(57) ABSTRACT

An inspection apparatus for inspecting wires of an object in which a plurality of x-axis and y-axis wires are arranged perpendicular to each other, each x-axis and y-axis wire having a display wire and tab wire, respectively. The apparatus includes a power supply device supplying an AC signal to the wire as an inspection object; a connecting device being in conductive contact with the tab wire to transmit the AC signal, a first detecting device disposed in a non-contact manner at one end of the display wire and conductively connected to one end of the power supply device, a second detecting device disposed in the non-contact manner and opposed to the display wire and conductively connected to the one end of the power supply device, and a determining device determining quality of the wire on the basis of results of the first and second detecting devices.

11 Claims, 3 Drawing Sheets

(56) References Cited

FOREIGN PATENT DOCUMENTS

| JP | 2002365325 A | 12/2002 | | |
| JP | 2005274225 A | 10/2005 | | |
| JP | 2011220916 A | * | 11/2011 | ............. G01R 31/02 |

* cited by examiner

[Fig. 1]
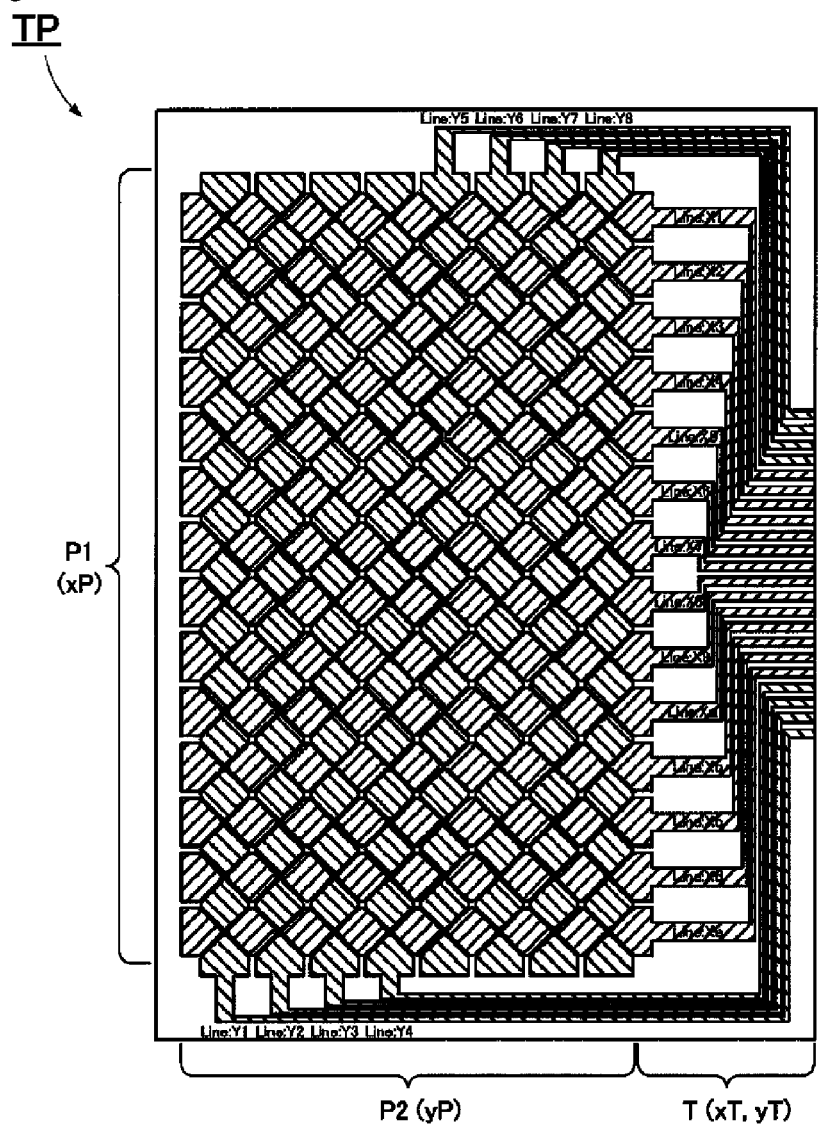

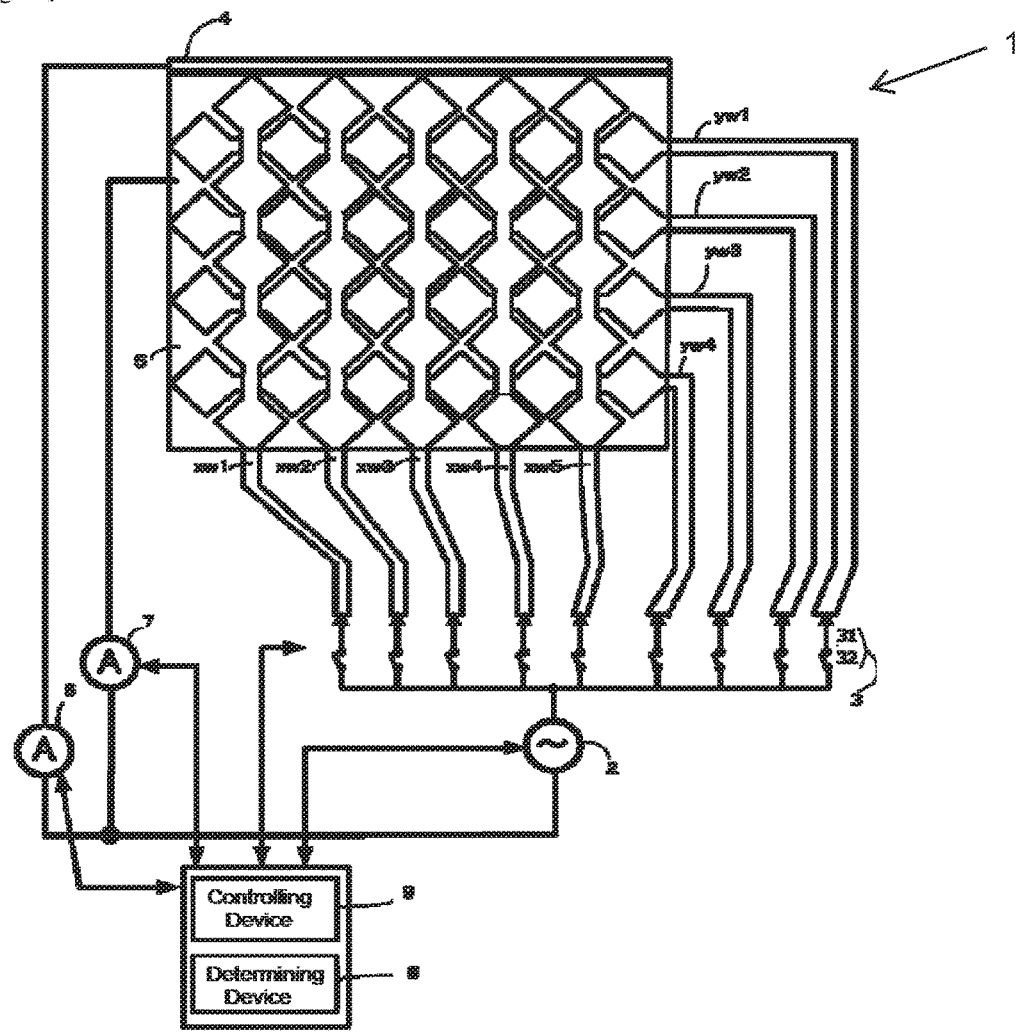
[Fig. 2]

[Fig. 3]
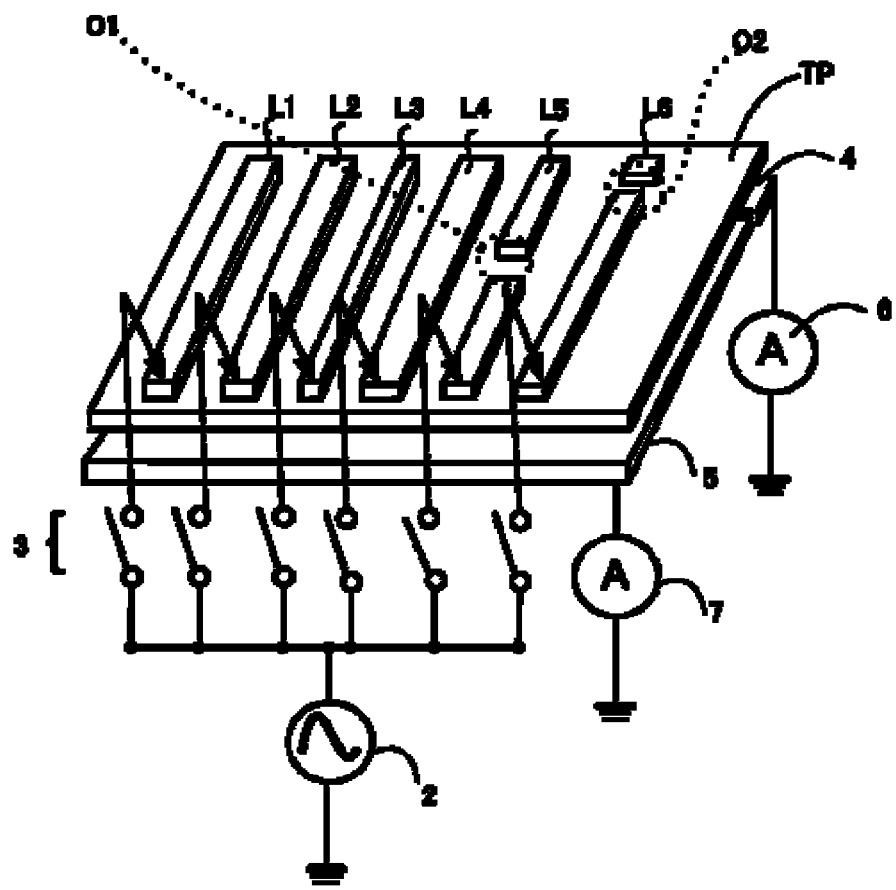

INSPECTION APPARATUS AND INSPECTION METHOD

RELATED APPLICATIONS

The present application is a national stage entry according to 35 U.S.C. §371 of PCT application No.: PCT/JP2014/002005 filed on Apr. 8, 2014, which claims priority from Japanese application No.: 2013-081279 filed on Apr. 9, 2013, and is incorporated herein by reference in its entirety.

TECHNICAL FIELD

Various embodiments relate to an inspection apparatus and an inspection method which detect electrical characteristics of a touch panel, thereby inspecting the touch panel. Various embodiments more specifically relate to an inspection apparatus and an inspection method which detect an electrical signal in a non-contact manner, thereby detecting thickening and thinning of a wire formed on the touch panel without damaging the touch panel, and which can quickly and efficiently inspect quality of the wire.

Various embodiments may perform the inspection on an inspection object having wires (or patterns) arranged in a matrix in an x-axis direction and a y-axis direction. The inspection objects as described above are collectively referred to as the "touch panel" in the description.

BACKGROUND

In the inspection object having the wires arranged in the matrix in the x-axis direction and the y-axis direction formed on an ITO film referred to as the touch panel (or a touch screen or a touch display), conventionally, conduction of each wire and a short-circuit between adjacent wires are inspected by bringing each contactor (or needle-shaped conductive probe) into contact with respective one of the wires arranged in the x-axis direction and the y-axis direction.

However, in the method of performing the inspection by bringing each contactor into contact with respective one of the wires as described above, there is no stability between the wire formed on the ITO film and the contactor, and the instability of contact resistance due to the oxide film causes inaccurate measurement of the electrical characteristic, which is problematic. Moreover, since the contactor is pressure-welded with the wire as the inspection object, there is such a problem that a dent or damage is formed due to the contact of the contactor with the wire.

On the other hand, as disclosed in Japanese Patent Application Laid Open No. 2005-274225, there is also proposed an inspection technology of accurately inspecting the electrical characteristics such as a resistance value of the touch panel as a whole, in which a predetermined touch input position on the touch panel assembled can be accurately detected. As described above, there is disclosed a technology of inspecting the electrical characteristics of the functions of the touch panel assembled.

There is also another technology, other than the technology disclosed in Japanese Patent Application Laid Open No. 2005-274225, in which due to the arrangement of the touch panel for crossing x-axis wires and y-axis wires, the contactor is brought into contact with an intersection point at which the x-axis wire crosses y-axis wire, an inspection signal is supplied from each of the x-axis wire and y-axis wire, and the quality of the x-axis wire and y-axis wire is determined from a detection signal from the contactor.

In the inspection method as described above, however, the inspection needs to be performed the number of times indicated by the multiplication of the total number of the x-axis wires and the total number of the y-axis wires, and there is such a problem that a long inspection time is required.

Recently, there has been a rising demand for productivity growth, and it is thus necessary to reduce a tact time and to complete the inspection in a short time. Particularly in recent years, the touch panel has been used as an inputting device which allows multi-touch, and thus, the entire panel surface needs to be accurately covered with the wires. Therefore, there is a rising demand to detect and determine not only the conduction and short-circuit of the wires but also the thickening and thinning of the wires.

SUMMARY

Various embodiments provide an inspection apparatus and an inspection method which can reduce the inspection time and which can efficiently perform the inspection of the thickening and thinning of the wire, even on the inspection object, such as the touch panel, having the wires arranged in the matrix in the x-axis direction and the y-axis direction An embodiment according to example 1 provides an inspection apparatus configured to inspect each wire of an object to be inspected in which a plurality of x-axis wires and a plurality of y-axis wires are arranged perpendicular to each other, each x-axis wire provided with an x-axis display wire and an x-axis tab wire, each y-axis wire provided with a y-axis display wire and a y-axis tab wire, the inspection apparatus provided with: a power supply device configured to supply an alternating current (AC) signal to the wire as an inspection object; a connecting device configured to be in conductive contact with the tab wire of the wire as the inspection object and to transmit the AC signal; a first detecting device disposed in a non-contact manner at one end of the display wire of the wire as the inspection object and conductively connected to one end of the power supply device; a second detecting device disposed in the non-contact manner and opposed to the display wire of the wire as the inspection object and conductively connected to the one end of the power supply device; a first measuring device configured to measure an electrical signal between the first detecting device and the power supply device; a second measuring device configured to measure an electrical signal between the second detecting device and the power supply device; and a determining device configured to determine quality of the wire as the inspection object on the basis of measurement results of the first measuring device and the second measuring device.

An embodiment according to example 2 provides the inspection apparatus according to example 1, wherein the second detecting device is formed to be disposed opposed to all the x-axis display wires and the y-axis display wires.

An embodiment according to example 3 provides the inspection apparatus according to example 2, wherein the second detecting device is formed dividedly perpendicular to the display wire as the inspection object or dividedly in a matrix in a perpendicular direction and in a parallel direction to the display wire.

An embodiment according to example 4 provides the inspection apparatus according to example 1, wherein the inspection apparatus is provided with a third detecting device disposed in the non-contact manner at one end of the y-axis display wire and conductively connected to the one end of the power supply device, and the first detecting device is disposed in the non-contact manner at one end of the x-axis display wire.

An embodiment according to example 5 provides an inspection method of inspecting each wire of an object to be inspected in which a plurality of x-axis wires and a plurality of y-axis wires are arranged perpendicular to each other, each x-axis wire provided with an x-axis display wire and an x-axis tab wire, each y-axis wire provided with a y-axis display wire and a y-axis tab wire, the inspection method provided with: a step of supplying an alternating current (AC) signal to the tab wire of the wire as an inspection object; a step of detecting a first detection signal detected from an electrode unit electrically connected in a non-contact manner to one end of the display wire of the wire as the inspection object, and a second detection signal detected from an electrode unit disposed opposed to and electrically connected in the non-contact manner to the display wire; and a step of inspecting the wire as the inspection object on the basis of the first detection signal and the second detection signal.

According to the embodiments described in examples 1 and 5, the use of the first and second detecting devices disposed in the non-contact manner on the display wire allows the inspection without damaging the display wire. The first detecting device detects the electrical signal from the one end of the display wire, which allows the conduction inspection of the display wire. Moreover, the arrangement of the second detecting device opposed to the display wire causes capacitive coupling according to the area of the display wire. By using this electrical signal, the thickening and thinning of the display wire can be detected. Moreover, since the first measuring device is disposed opposed to the one end of the display wire, the conduction inspection can be performed even on the end of the display wire.

According to the embodiment according to example 2, the arrangement opposed to all the x-axis display wires and the y-axis display wires allows efficient detection of the area of the display wire.

According to the embodiment according to example 3, the second detecting device is formed dividedly perpendicular to the display wire as the inspection object. Thus, the thickening and thinning of the display wire as the inspection object can be determined in a fragmented manner, which allows the provision of an inspection apparatus with high inspection accuracy.

According to the embodiment according to example 4, the provision of the third detecting device allows simultaneous inspection of the x-axis display wire and the y-axis display wire, and inspection tact can be thus improved.

BRIEF DESCRIPTION OF DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 is a schematic plan view illustrating one embodiment of a touch panel as an inspection object of the present disclosure, FIG. 2 is a plan view illustrating a schematic configuration of an inspection apparatus of one embodiment of the present disclosure, and FIG. 3 is a conceptual diagram for explaining an inspection performed by the inspection apparatus of the embodiment, illustrating display wires of the touch panel in one direction for convenience of explanation.

DETAILED DESCRIPTION

The following detailed description refers to the accompanying drawings that show, by way of illustration, specific details and aspects of this disclosure in which the invention may be practiced.

The inspection apparatus of one embodiment of the present disclosure can improve inspection efficiency for a circuit board and a glass substrate having a plurality of wires arranged in a matrix in an x-axis direction and a y-axis direction, such as a touch panel.

Thus, firstly, the touch panel as an inspection object of the inspection apparatus of one embodiment of the present disclosure will be briefly explained.

FIG. 1 is a schematic plan view illustrating one embodiment of the touch panel as the inspection object of the present disclosure. In a touch panel TP in FIG. 1, a plurality of x-axis wires arranged in the x-axis direction and a plurality of y-axis wires arranged in the y-axis direction are arranged on a glass substrate. In FIG. 1, 14 x-axis wires (represented by reference numerals Line: X1 to Line: Xe) are formed, and 8 y-axis wires (represented by reference numerals Line: Y1 to Line: Y8) are formed.

The x-axis wires and the y-axis wires on the touch panel TP are arranged to cover a touch area on a screen with the wires (or a portion covered with P1 and P2). As illustrated in FIG. 1, one x-axis wire (and one y-axis wire) is formed by repeating a wide portion and a narrow portion, and the wires are thus formed to cover the entire touch area. Due to the formation as described above, when the touch panel TP is used, it is possible to detect on which x-axis wire and on which y-axis wire a touched position (a contact position) is located. The touch area is formed of x-axis display wires xP of the respective x-axis wires and y-axis display wires yP of the respective y-axis wires.

In the touch panel TP in FIG. 1, the 14 x-axis wires and the 8 y-axis wires are formed; however, the number of the wires is not particularly limited to this example and is adjusted by a touch panel manufacturer, as occasion demands. The touch area of the touch panel TP and tab wires described later are also adjusted and formed by the manufacturer, as occasion demands. The length and size of the wide portion and the narrow portion are also adjusted by the touch panel manufacturer, as occasion demands.

The x-axis wire and the y-axis wire have an x-axis tab wire xT and a y-axis tab wire yT (or tab wire parts T) formed, respectively, such that one end of the x-axis wire or y-axis wire can be connected to an electronic component, such as a driver. The tab wire part T is formed by extending each electric connection part connected to another electronic component. The tab wire part T is formed in a place away from the touch area, as viewed planarly, thereby allowing electrical connection. In the touch panel TP in FIG. 1, the tab wire part T of each wire (or the x-axis wire and the y-axis wire) is formed on the right side of the sheet. The tab wire parts T can be formed in parallel in one place other than the touch area. The x-axis wire is formed of the x-axis display wire xP and the x-axis tab wire xT. The y-axis wire is formed of the y-axis display wire yP and the y-axis tab wire yT.

In the description, for convenience of explanation, a display wire w1 is used to indicate the x-axis display wire xP and/or y-axis display wire yP, and a tag wire w2 is used to indicate the x-axis tag wire xT and/or y-axis tag wire yT.

An inspection apparatus 1 of one embodiment of the present disclosure has a power supply device 2, a connecting device 3, a first detecting device 4, a second detecting device 5, a first measuring device 6, a second measuring device 7, and a determining device 8. FIG. 2 is a view illustrating a schematic configuration of the inspection apparatus 1. FIG. 3 is a conceptual diagram for explaining the inspection performed by the inspection apparatus.

The power supply device 2 supplies an AC signal to the wire as the inspection object. The power supply device 2 needs to generate the AC signal. For example, the power supply device 2 can set the AC signal having a voltage value with an effective value ranging from 1 to 10 V in a frequency range of 10 kHz to 100 kHz. The power supply device 2 is connected to the connecting device 3 described later at one end, and is connected to the first detecting device 4 and the second detecting device 5 described later at the other end.

The connecting device 3 is in conductive contact with the tab wire w2 of the wire as the inspection object and transmits the AC signal from the power supply device 2. The connecting device 3 has a function of being electrically connected to the power supply device 2. For example, the connecting device 3 can use a contactor 31 to be connected to the tab wire w2, and a change unit 32 for changing the electrical connection with the power supply device 2. There are prepared the same number of contactors 31 as the number of the tab wires w2, and the contactors 31 are connected to the respective tab wires w2. The change unit 32 can adopt, for example, a switching element configured to perform an ON/OFF operation. The operation of the change unit 32 allows conductive connection between the power supply device 2 and the tag wire w2.

The first detecting device 4 is disposed in a non-contact manner at one end of the display wire w1 of the wire as the inspection object, and is conductively connected to the other end of the power supply device 2. Since the first detecting device 4 is disposed in the non-contact manner at one end of the display wire w1, the first detecting device 4 can detect an electrical signal from the end. Thus, the conduction inspection of the wire as the inspection object (or the display wire w1 and the tag wire w2) can be performed on the basis of the electrical signal detected by the first detecting device 4.

The first detecting device 4 is required to have a function of extracting the electrical signal from the display wire w1. More specifically, the first detecting device 4 can be formed of an electrically conductive plate-like member, or can also adopt a thin lead wire. In particular, the adoption of the lead wire by the first detecting device 4 makes it easy for the first detecting device 4 to be disposed at the end of the display wire w1, and allows inexpensive manufacturing.

The first detecting device 4 is preferably disposed to be in non-contact connection with, for example, all the display wires arranged in one direction (or the x-axis display wires, or the y-axis display wires). For example, in FIG. 3, the first detecting device 4 is connected in the non-contact manner to one end of all the display wires represented by reference numerals L1 to L6. The provision of the first detecting device 4 in this manner enables batch inspection or simultaneous inspection of the plurality of display wires w1.

As described above, the first detecting device 4 can perform the batch inspection of the plurality of display wires w1 arranged in one direction, without moving the first detecting device 4. There can be also provided a third detecting device (not illustrated) disposed perpendicular to the first detecting device 4, in order to set another inspection object that is the display wire w1 other than the display wire w1 set as the inspection object by the first detecting device 4. The third detecting device has the same configuration as that of the first detecting device 4 but is disposed in a different position from the first detecting device 4. For example, if the first detecting device 4 is disposed in the non-contact manner with respect to the x-axis display wires, the third detecting device is disposed in the non-contact manner with respect to the y-axis display wires. By using the two detecting devices which are the first and third detecting devices, the x-axis display wires and the y-axis display wires can be inspected simultaneously.

The second detecting device 5 is disposed in the non-contact manner and opposed to the display wire w1 of the wire as the inspection object. Moreover, the second detecting device 5 is conductively connected to the other end of the power supply device 2. The second detecting device 5 has a shape at least larger than the display wire w1 as the inspection object, and requires a size large enough for capacitive coupling between the entire surface of the display wire w1 and the second detecting device 5. As described above, since the second detecting device 5 has the size that allows the capacitive coupling between the entire surface of the display wire w1 and the second detecting device 5, an electrical signal detected by the second detecting device 5 is an electrical signal according to the area of the display wire w1. Thus, the thickening and thinning of the display wire w1 can be determined by using the electrical signal of the second detecting device 5.

The second detecting device 5 is preferably disposed opposed to all the display wires w1. Due to the arrangement of the second detecting device 5 in this manner, it is possible to detect the electrical signal of the desired wire (or the display wire), without depending on the position of the wire as the inspection object by controlling the wire supplied with the electrical signal from the power supply device 2. For example, in FIG. 3, the second detecting device 5 is formed in a plate shape to cover all the display wires w1 represented by the reference numerals L1 to L6. The second detecting device 5 is preferably formed to be substantially equal to or slightly larger than a portion of the touch panel TP in which the display wires w1 are formed. This is because the opposed arrangement can be performed to cover all the display wires w1 formed on the touch panel TP, due to the formation as described above.

The second detecting device 5 can be also formed dividedly perpendicular to the display wire w1 as the inspection object. In the case of the divided arrangement of the second detecting device 5 as described above, one display wire w1 as the inspection object is divided by a plurality of divided second detecting devices 5, and each divided second detecting device 5 detects an electrical signal in respective one of divided display-wire-w1 portions. In other words, due to the configuration as described above, the plurality of divided second detecting devices 5 divide the display wire w1 to obtain respective corresponding portions, and can detect the electrical signals according to the shape (or area) of the respective portions. By dividing the second detecting device 5 in this manner, the inspection portion of the display wire w1 is divided, which allows more accurate detection of the thickening and thinning of each of the divided display-wire-w1 portions.

In order to accurately perform the inspection of the thickening and thinning on both the x-axis display wire xP and the y-axis display wire yP, both the x-axis display wire xP and the y-axis display wire yP can be coped with by dividedly arranging the second detecting device 5 in the matrix.

If the second detecting device 5 is divided, the division is preferably performed to provide substantially the same width as that of the wide portion of the x-axis display wire xP and the y-axis display wire yP. This is because it is possible to detect the electrical signal that allows the detection of the thickening and thinning of the wire according to the shape of the wide portion, due to the formation as described above.

The first measuring device 6 measures the electrical signal between the first detecting device 4 and the power supply device 2. The first measuring device 6 is connected in series with the first detecting device 4 at one end, and is connected in series with the power supply device 2 at the other end. As the first measuring device 6, for example, an ammeter can be used. A measurement signal measured by the first measuring device 6 is an electrical signal caused by a conductive state of the wire as the inspection object. The first measuring device 6 transmits the measurement signal to the determining device 8.

The second measuring device 7 measures the electrical signal between the second detecting device 5 and the power supply device 2. The second measuring device 7 is connected in series with the second detecting device 5 at one end, and is connected in series with the power supply device 2 at the other end. As the second measuring device 7, for example, an ammeter can be used. A measurement signal measured by the second measuring device 7 is an electrical signal caused by the area of the display wire w1 of the wire as the inspection object. The measurement signal from the second measuring device 7 is influenced by a change in capacitive coupling according to the area of the display wire w1. The second measuring device 7 transmits the measurement signal to the determining device 8.

The second measuring device 7 is connected to the second detecting device 5 as described above. If the second detecting device 5 is dividedly formed, each of the divided second detecting devices 5 can be connected to the second measuring device 7 by changing or switching, or the second measuring devices 7 according to the number of the divided second detecting devices 5 can be provided and connected to the respective divided second detecting devices 5 in a one-to-one manner. In the case of the connection in the one-to-one manner, the detected electrical signals can be simultaneously processed, and the inspection tact can be reduced.

The determining device 8 determines the quality of the wire as the inspection object on the basis of measurement results of the first measuring device 6 and the second measuring device 7. The determining device 8 determines the conductive state of the wire as the inspection object from the measurement signal from the first measuring device 6. The measurement signal from the first measuring device 6 indicates the conductive state of the wire as the inspection object. By comparing the measurement signal with a reference value of a non-defective product, the quality of the conductive state can be determined. For example, if the wire as the inspection object is the non-defective product (there is no conduction abnormality in the wire), the measurement signal has the same or substantially the same output as the reference value. On the other hand, if the wire as the inspection object has the conduction abnormality (there is a disconnection in the wire), the measurement signal has lower output than the reference value. In other words, the determining device 8 compares the measurement signal from the first measuring device 6 with the reference value set in advance, thereby determining the quality of the conductive state of the wire as the inspection object.

Moreover, the determining device 8 determines a shape state of the thickening and thinning of the display wire w1 of the wire as the inspection object from the measurement signal of the second measuring device 7. The measurement signal of the second measuring device 7 indicates the shape state of the display wire w1 portion of the wire as the inspection object. By comparing the measurement signal with a reference value of a non-defective product, the quality (or the thickening and thinning) of the shape state can be determined. Specifically, if the area of the display wire is greater (or thicker) than that of the display wire of the non-defective product, the capacitive coupling with the second detecting device 5 increases, and the measurement signal of the second measuring device 7 which is greater than the reference value is outputted. On the other hand, if the area of the display wire is less (or thinner) than that of the display wire of the non-defective product, the capacitive coupling with the second detecting device 5 decreases, and the measurement signal of the second measuring device 7 which is less than the reference value is outputted. In other words, by comparing the measurement signal from the second measuring device 7 with the reference value set in advance, the quality of the shape state of the thickening and thinning of the wire as the inspection object can be determined. If the second detecting device 5 and the second measuring device 7 are dividedly formed to provide the plurality of second detecting devices 5 and the plurality of second measuring devices 7, then, the measurement signal of each of the second measuring devices 7 is compared with a reference value set in advance according to each divided portion.

Now, with reference to FIG. 3, a concept of the inspection performed by the inspection apparatus will be explained. The touch panel TP in FIG. 3 has the display wires L1 to L6 formed thereon. The display wire L1 and the display wire L2 are non-defective products. The display wire L3 has the thinning of the wire. The display wire L4 has the thickening of the wire. The display wire L5 has a disconnection 01 formed near the center of the display wire. The display wire L6 has a disconnection 02 in the vicinity of the end of the display wire.

If the AC signal for performing the inspection is applied from the power supply device 2, the signal is applied to each of the display wires L1 to L6 by the connecting device 3. The first measuring device 6 measures the electrical signal via the first detecting device 4. At the same time, the second measuring device 7 measures the electrical signal via the first detecting device 5. The first measuring device 6 and the second measuring device 7 can measure the electrical signals according to the respective state of the display wire.

If the inspection object is the display wire L1, the first measuring device 6 and the second measuring device 7 measure the same or substantially the same values as the respective reference values set in advance. The same applies if the inspection object is the display wire L2.

If the inspection object is the display wire L3, the first measuring device 6 measures the same or substantially the same value as the reference value thereof. On the other hand, the second measuring device 7 is influenced by the thinning of the display wire L3, and obtains an output value less than the reference value thereof.

If the inspection object is the display wire L4, the first measuring device 6 measures the same or substantially the same value as the reference value thereof. On the other hand, the second measuring device 7 is influenced by the thickening of the display wire L3, and obtains an output value greater than the reference value thereof.

If the inspection object is the display wire L5, the first measuring device 6 is influenced by the disconnection near the center, and obtains an output value less than the reference value thereof. In the same manner, the second measuring device 7 is influenced by the disconnection near the center, and obtains an output value less than the reference value thereof.

If the inspection object is the display wire L6, the first measuring device 6 is influenced by the disconnection in the vicinity of the end, and obtains an output value less than the reference value thereof. On the other hand, the second measuring device 7 is not influenced by the disconnection because the disconnection is in the vicinity of the end, and obtains the same or substantially the output value as the reference value thereof.

As described above, the conductive state and the shape state of the display wire w1 can be determined from the measurement results of the first measuring device 6 and the second measuring device 7.

The inspection apparatus 1 has a controlling device 9. The controlling device 9 has a storage unit (not illustrated) configured to store therein information necessary to inspect the touch panel TP, such as information about the reference value described above, an inspection method, and an inspection procedure. The information necessary to perform the inspection is used from the storage unit. The controlling device controls the operation of the power supply device 2, the connecting device 3, the first detecting device 4, the second detecting device 5, the first measuring device 6, the second measuring device, and the determining device 8. In particular, the controlling device 9 activates the power supply device 2 to apply the AC signal for performing the inspection, activates the connecting device 3 to select the inspection object, and activates the determining device 8 to determine the quality of the wire as the inspection object on the basis of the measurement signals from the first measuring device 6 and the second measuring device 7.

The above is the explanation of the configuration of the inspection apparatus 1.

Next, the operation of the inspection apparatus of the embodiment will be explained.

FIG. 3 is a schematic diagram illustrating the inspection apparatus 1 if the touch panel TP is installed. In the inspection apparatus, the first detecting device 4 is disposed opposed to and below one end of the x-axis display wires xP, and the second detecting device 5 is disposed below and to cover the x-axis display wires xP and the y-axis display wires yP.

The information about the inspection is stored in the storage unit of the controlling device in advance, and for example, the reference value information for determining the quality or the like is stored. On the basis of the stored information, the controlling device transmits a control signal for performing the inspection to each function if necessary.

If the inspection apparatus 1 performs the inspection, firstly, the wire as the inspection object is selected. In the case of FIG. 2, an x-axis wire x1 to an x-axis wire x5 arranged longitudinally are inspected. Firstly, the x-axis wire x1 is selected, and the controlling device operates the connecting device 3 to set the x-axis wire x1 as the inspection object. At this time, the connecting device 3 operates to conductively connect the x-axis wire x1 to the power supply device 2. If there is a switching element, an ON-operation of only a switch connected to the x-axis wire x1 allows electrical connection to the power supply device 2. Although FIG. 2 does not illustrate the ON/OFF operation of the switching element, the ON/OFF operation of the switching element allows the connection.

If the power supply device 2 is connected to the x-axis wire x1, the controlling device activates the power supply device 2 to supply the AC signal therefrom. At this time, the power supply device 2 supplies the AC signal to the x-axis wire x1.

If the AC signal is supplied from the power supply device 2, the first detecting device 4 and the second detecting device 5 detect the electrical signals according to the state of the x-axis wire x1 and the state of the x-axis display wire, respectively. If the first detecting device 4 and the second detecting device 5 detect the electrical signals, the electrical signals are measured by the first measuring device 6 and the second measuring device 7. The first measuring device 6 and the second measuring device 7 transmit information about the measurements to the determining device 8.

The determining device 8 compares each of the measurement information from the first measuring device 6 and the measurement information from the second measuring device 7 with respective one of the reference values set in advance. The determining device 8 compares measurement values (or measurement results) with the reference values, as described above, thereby determining the quality. In this case, the determining device 8 determines the conductive state of the x-axis wire x1 from a comparison result between the measurement value of the first measuring device 6 and the reference value, and the determines the shape state of the x-axis display wire from a comparison result between the measurement value of the second measuring device 7 and the reference value.

If the determination of the x-axis wire x1 is ended, the next inspection is performed on the x-axis wire x2 as the inspection object, and the inspection is performed up to the x-axis wire x5.

If no abnormality is detected after the inspection of all the x-axis wires, the wires are determined to be non-defective. In this inspection apparatus 1, the x-axis wires are the inspection object. Thus, the y-axis wires can be also inspected by rotating the touch panel TP by 90 degrees. If the inspection of all the x-axis wires and the y-axis wires is completed and all the wires are non-defective, then, the touch panel TP is determined to be a non-defective product. The above is the explanation of the operation of the inspection apparatus of the present disclosure.

In the embodiment in FIG. 2, the explanation was given to the case where the third detecting device is not provided. The inspection can be also efficiently performed by using the third detecting device corresponding to the y-axis wires, or the like, without rotating the touch panel TP.

The inspection apparatus 1 can detect the thickening and thinning of the display wire of the touch panel TP. Thus, the inspection apparatus 1 can not only determine the touch panel TP but also manage a manufacturing process of the touch panel from the thickening and thinning of the wire.

The inspection apparatus 1 can also perform insulation inspection between the wires. In this case, desired two wire groups to perform the insulation inspection on are prepared, and a resistance value between the groups is calculated, by which the insulation inspection can be performed.

The invention claimed is:

1. An inspection apparatus configured to inspect each wire of an object to be inspected in which a plurality of x-axis wires and a plurality of y-axis wires are arranged perpendicular to each other, each x-axis wire comprising an x-axis display wire and an x-axis tab wire, each y-axis wire comprising a y-axis display wire and a y-axis tab wire, said inspection apparatus comprising:
- a power supply device configured to supply an alternating current (AC) signal to the wire as an inspection object;
- a connecting device configured to be in conductive contact with the tab wire of the wire as the inspection object and to transmit the AC signal;
- a first detecting device disposed in a non-contact manner at one end of the display wire of the wire as the inspection object and conductively connected to one end of the power supply device;
- a second detecting device disposed in the non-contact manner and opposed to the display wire of the wire as the inspection object and conductively connected to the one end of the power supply device;
- a first measuring device configured to measure an electrical signal between the first detecting device and the power supply device;
- a second measuring device configured to measure an electrical signal between the second detecting device and the power supply device; and
- a determining device configured to determine quality of the wire as the inspection object on the basis of measurement results of the first measuring device and the second measuring device.

2. The inspection apparatus according to claim 1, wherein the second detecting device is formed to be disposed opposed to all the x-axis display wires and the y-axis display wires.

3. The inspection apparatus according to claim 2, wherein the second detecting device is formed dividedly perpendicular to the display wire as the inspection object or dividedly in a matrix in a perpendicular direction and in a parallel direction to the display wire.

4. The inspection apparatus according to claim 1, wherein
- said inspection apparatus comprises a third detecting device disposed in the non-contact manner at one end of the y-axis display wire and conductively connected to the one end of the power supply device, and
- the first detecting device is disposed in the non-contact manner at one end of the x-axis display wire.

5. An inspection method of inspecting each wire of an object to be inspected in which a plurality of x-axis wires and a plurality of y-axis wires are arranged perpendicular to each other, each x-axis wire comprising an x-axis display wire and an x-axis tab wire, each y-axis wire comprising a y-axis display wire and a y-axis tab wire, said inspection method comprising:
- supplying an alternating current (AC) signal to the tab wire of the wire as an inspection object;
- detecting a first detection signal detected from a first electrode unit electrically connected in a non-contact manner to one end of the display wire of the wire as the inspection object, and a second detection signal detected from a second electrode unit disposed opposed to all the x-axis display wires and the y-axis display wires, and electrically connected in the non-contact manner to the display wires; and
- inspecting the wire as the inspection object on the basis of the first detection signal and the second detection signal.

6. The inspection method of claim 5, further comprising forming the second electrode unit dividedly perpendicular to the display wire as the inspection object, or dividedly in a matrix in a perpendicular direction and in a parallel direction to the display wire.

7. The inspection method of claim 5, further comprising disposing a third electrode unit in a non-contact manner at one end of the y-axis display wire and conductively connected to one end of the power supply device.

8. An inspection apparatus configured to inspect each wire of an object to be inspected in which a plurality of x-axis wires and a plurality of y-axis wires are arranged perpendicular to each other, each x-axis wire comprising an x-axis display wire and an x-axis tab wire, each y-axis wire comprising a y-axis display wire and a y-axis tab wire, said inspection apparatus comprising:
- a power supply device configured to supply an alternating current (AC) signal to the wire as an inspection object;
- a connecting device configured to be in conductive contact with the tab wire of the wire as the inspection object and to transmit the AC signal;
- a first detecting device conductively connected to one end of the power supply device and configured to be disposed in a non-contact manner at one end of the display wire of the wire as the inspection object;
- a second detecting device conductively connected to the one end of the power supply device and configured to be disposed in the non-contact manner and opposed to the display wire of the wire as the inspection object;
- a first measuring device configured to measure an electrical signal between the first detecting device and the power supply device;
- a second measuring device configured to measure an electrical signal between the second detecting device and the power supply device; and
- a determining device configured to determine quality of the wire as the inspection object on the basis of measurement results of the first measuring device and the second measuring device.

9. The inspection apparatus according to claim 8, wherein the second detecting device is configured to be disposed opposed to all the x-axis display wires and the y-axis display wires.

10. The inspection apparatus according to claim 9, wherein the second detecting device is formed dividedly perpendicular to the display wire as the inspection object or dividedly in a matrix in a perpendicular direction and in a parallel direction to the display wire.

11. The inspection apparatus according to claim 8, wherein
- said inspection apparatus comprises a third detecting device configured to be disposed in the non-contact manner at one end of the y-axis display wire and conductively connected to the one end of the power supply device, and
- the first detecting device is configured to be disposed in the non-contact manner at one end of the x-axis display wire.

* * * * *